June 3, 1969 A. L. HATCHER, JR 3,447,236

METHOD OF BONDING AN ELECTRICAL PART TO AN ELECTRICAL CONTACT

Filed Feb. 11, 1966

INVENTOR
A.L.HATCHER, JR.
BY [signature]
ATTORNEY

United States Patent Office 3,447,236
Patented June 3, 1969

3,447,236

METHOD OF BONDING AN ELECTRICAL PART TO AN ELECTRICAL CONTACT

Arthur L. Hatcher, Jr., Sinking Spring, Pa., assignor to Western Electric Company, Incorporated, New York, N.Y., a corporation of New York Filed Feb. 11, 1966, Ser. No. 526,762
Int. Cl. H01l *1/10;* B01j *17/00*
U.S. Cl. 29—588 2 Claims

ABSTRACT OF THE DISCLOSURE

A method of joining and encapsulating nickel-coated molybdenum studs in a diode assembly to a semiconductor wafer having silver contacts by applying aluminum to the nickel and then positioning the studs and wafer in a glass sleeve after which the assembly is heated to a predetermined temperature to form an alloy interface between the aluminum and silver and then further heated to a temperature greater than the predetermined temperature to fuse the sleeve to the studs.

This invention relates to a method of bonding two essentially nonalloying metallic parts together to form a reliable ohmic, electrical interconnection therebetween and, more particularly, to a method of insuring that a metallurgical rather than a physical bond is established between an electrical part, having a coating thereover consisting essentially of a metal selected from the group consisting of nickel, palladium and platinum, and an electrical contact consisting essentially of silver. It is an object of this invention to provide an improved method of such character.

It has been common practice heretofore in the manufacture of many types of electrical components and devices having leads, elements or parts necessitating the establishment of an ohmic, electrical contact therebetween, to effect a metallurgical bond or alloy interface therebetween by means of a suitable heat treatment. The establishment of such a metallurgical bond has presented problems in certain situations because of the nonalloying nature of the metal parts desired to be bonded together.

This has been particularly true in the manufacture of certain types of semiconductor diodes which necessitate very reliable metallurgically bonded ohmic contacts in order to insure reliable operation of the fabricated devices. For example, in one particular type of semiconductor diode, a pair of molybdenum stud-lead assemblies are employed to make contact respectively with silver contacts on opposite sides of a semiconductor wafer. Molybdenum is chosen because its thermal coefficient of expansion characteristics substantially match those of the semiconductor material, because it seals to certain types of glass and further because molybdenum exhibits excellent thermal conductance characteristics. Silver is used as the contact areas on the semiconductor wafer primarily because it exhibits excellent thermal and conductive characteristics, is readily and easily deposited on the semiconductor wafer material and is free from oxidation if properly prepared. Molybdenum, however, does have a disadvantageous characteristic, that being the tendency of the exposed surfaces thereof to oxidize during the sealing of this metal in a glass sleeve. Inasmuch as such a surface would adversely affect both the bonding of the molybdenum to the silver either directly or indirectly and the resistance characteristics across such a bond, a nickel coating is often applied to the surface areas of the stud-lead assemblies whereat ohmic contacts are desired. Nickel is generally chosen over any of the precious metals, such as gold, not only because of cost considerations, but because it readily bonds to molybdenum, exhibits excellent thermal and conductive characteristics and is immune to oxidation. However, it should be noted that palladium or platinum may also be used in place of nickel in accordance with the principles of the present invention.

The resulting difficulty encountered in bonding the nickel coated stud-lead assemblies to the silver contact areas of the wafer resides in the fact that nickel and silver do not readily form an alloy interface or junction when subjected to heat within a range which would not damage or impair the operating characteristics of a semiconductor element. Similarly, palladium and platinum do not readily form an alloy interface with silver.

As a result, the contact which is established between the nickel-coated surfaces of the stud-lead assemblies and the associated silver contacts of the semiconductor wafer may be characterized as comprising essentially a "physical bond" as distinguished from a metallurgical bond between the two surface areas in question.

That is reliable metallurgical bond is not always established between the nickel and the silver has been evidenced by the fact that many of the fabricated diodes of the type in question have either failed partially, intermittently or totally within their normally expected life span as a result of the diodes being subjected to either shock or vibration. Erratic electrical behavior has also been observed as a result of subjecting the semiconductor diode to high current pulses, such pulses degrading the quality of the ohmic connection between the stud-lead assembly and the wafer. Many of such failures have been attributed to an impairment of the ohmic interconnection in such a way as to increase the resistance thereacross to such an extent that the device either becomes inoperative or unsuitable for further use in an intended application. While the exact nature of the impairment to the ohmic contact is not positively known, it appears likely that either a reduction in or the total elimination of the normally effective mutual surface contact area between the stud-lead assemblies and the semiconductor wafer gives rise to the problem in question.

It becomes readily apparent, of course, that any change in the contacting surface area between the parts in question would adversely affect the electrical characteristics of the desired ohmic contacts which, in turn, would adversely affect the operating characteristics of a given diode. An ohmic contact may be defined as one across which no appreciable rectification, if any, takes place or across which current is delivered to a semiconductor element without entering into an active process. To appreciate the importance of having good ohmic contacts in a semiconductor diode, reference need be made only to the fact that a minimum ohmic resistance is necessary to maximize the reverse-to-forward impedance ratio of the diode, and to suppress the generation of minority carriers in the ohmic contact areas, which minority carriers would otherwise impair the switching characteristics of the diode.

Accordingly, it is another object of this invention to provide a method of forming a metallurgically bonded, ohmic contact between an electrical part having a coating thereover consisting essentially of a metal selected from the group consisting of nickel, palladium and platinum, and an electrical contact consisting essentially of silver.

It is still another object of this invention to provide a method of bonding a nickel coated part to a silver contact, which method insures that the bond so formed is of a metallurgical nature rather than a physical nature.

It is a further object of this invention to provide a method of metallurgically bonding a nickel coated stud-lead assembly of a semiconductor diode to a silver contact, which method insures that the bond so formed is substantially resistant to electrical breakdown when subjected to a relatively severe shock, substantial vibration or high current pulses.

It is a still further object of this invention to provide a method of metallurgically bonding a molybdenum stud-lead assembly having a nickel coating thereover to a silver contact of a semiconductor wafer, which bonding method may be carried out simultaneously in the same process with the encapsulation of the stud-lead assembly and the semiconductor wafer within a glass sleeve.

It is yet a further object of this invention to provide a method of metallurgically bonding a nickel coated portion of an electrical part to a silver contact, which method is simple and reliable in operation and economical to utilize.

In accordance with the foregoing objects and, further, to resolve the problem presented by the prior art, one surface of an electrical lead or part having a coating applied thereover consisting essentially of a metal selected from the group consisting of nickel, palladium and platinum, is metallurgically bonded to an electrical contact consisting essentially of silver by the following method. Initially the metal coating of the part is coated with a thin layer of aluminum. Thereafter, the part and the contact are placed in such relative positions that the aluminum on the part physically contacts the silver contact. The two metals are then heated to a temperature sufficient so that at least a portion of the aluminum melts and creates a liquid interface between the aluminum and the silver. The metals, as well as the liquid interface therebetween, are thereafter cooled so that the liquid interface forms a eutectic alloy whereby a metallurgically bonded, ohmic contact is formed between the two metals. In the preferred embodiment of this invention, two mutually opposed nickel coated stud surfaces of a pair of stud-lead assemblies made of molybdenum are respectively metallurgically bonded to silver contacts on a semiconductor wafer to form a diode.

This invention, together with further objects and advantages thereof will best be understood by reference to the following description taken in conjunction with the accompanying drawings, in which.

The preferred embodiment of the method of this invention is described in conjunction with a particular electrical device, namely, a semiconductor device of the diode type. It is to be understood, however, that the method of this invention may be employed wherever it is necessary to metallurgically bond a metal selected from the group consisting of nickel, palladium and platinum, which metal either forms a coating on or at least comprises a portion of one part, to at least a silver area of another part so as to form an electrical, ohmic contact area therebetween.

Figure 1:
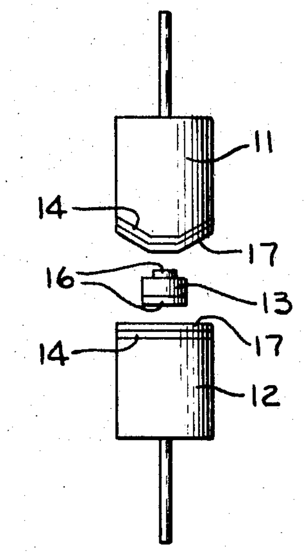
FIG. 1 is a schematic representation of a pair of stud-lead assemblies and a semiconductor wafer prior to their assembly to form a semiconductor device.

With reference to FIG. 1 of the associated drawings, there is shown therein a first stud-lead assembly 11, a second stud-lead assembly 12 and a semiconductor wafer 13. Selected mutually opposed areas of the studs 11 and 12 are bonded to prescribed contact areas on the semiconductor wafer 13 in order to form a diode semiconductor device.

The stud-lead assemblies 11 and 12 of the diode device described in conjunction with the preferred embodiment of the invention discussed herein, are formed essentially of molybdenum. As is well known, molybdenum readily oxidizes upon being exposed to a glass sealing environment. Oxidation of the stud surfaces relied upon to form electrical connections with the silver contacts is, of course, undesirable, for such oxidation produces high resistance electrical paths between the associated studs and contacts.

Therefore, to prevent oxidation of the molybdenum studs during a glass sealing operation, it has been standard practice in the art, in the manufacture of one particular type of diode, to sputter a thin coating of nickel on at least that portion of each stud which is to be connected to an electrical contact, the nickel thereby serving as a monoxidizing protective coating therefor. Thus, in FIG. 1 there is shown a thin coating of nickel metal 14 associated with both stud-lead assemblies 11 and 12. In the preferred embodiment of the invention, the nickel coating 14 has a thickness of approximately three thousand angstroms. Since metal sputtering processes are well known in the art, no detailed description of the nickel metal sputtering operation will be set forth herein. If palladium or platinum had been selected for the metal coating, instead of the nickel described in conjunction with the preferred embodiment of this invention, no changes would have to be made in the method of this invention as set forth hereinbelow.

The semiconductor wafer 13 of the diode type has both upper and lower silver contacts 16. The contacts are placed on the wafer 13 by any one of the several methods known to those skilled in the art.

In prior manufacturing practices, the nickel coated portions 14 of the stud-lead assemblies 11 and 12 were electrically connected to the silver contacts 16 of the semiconductor wafer 13 by means of a so-called "physical bonding" process. More particularly, the nickel coated portions 14 of the respective stud-lead assemblies 11 and 12 were placed in physical contact with associated ones of the silver contacts 16 on the wafer 13, and thereafter held in relatively fixed positions with respect thereto by means of a glass sleeve which encapsulated the stud-lead assemblies 11 and 12 and the semiconductor wafer 13. However, this type of "physical bonding" process left much to be desired in terms of providing a reliable electrical interconnection between the studs and contacts. For example, shocks, vibrations or high current pulses transmitted to the completed semiconductor device have a tendency to impair the interconnection in such a manner as to increase the resistance thereacross to such an extent as to render the device unsuitable for further use, particularly in performance demanding applications.

In accordance with the principles and teachings of the method of this invention, a stud with a nickel coated surface is electrically connected to a silver contact in such a manner that a metallurgically bonded, ohmic contact is formed therebetween. By providing such a metallurgical bond, the above described problem, encountered in the prior art method of physically bonding such a stud to a contact, has been overcome.

More specifically, in accordance with the teachings of the method of this invention, and as a first step in the method, a thin layer of aluminum metal 17 is evaporated over the nickel coating 14 of each of the stud-lead assemblies 11 and 12. In the preferred embodiment, the aluminum coating 17 is evaporated onto the nickel coating 14 to a thickness of approximately four thousand angstroms. Since the aluminum evaporation process may be carried out by any one of the many metal evaporation methods known in the art, no further discussion of the evaporation process will be presented herein.

Figure 2:
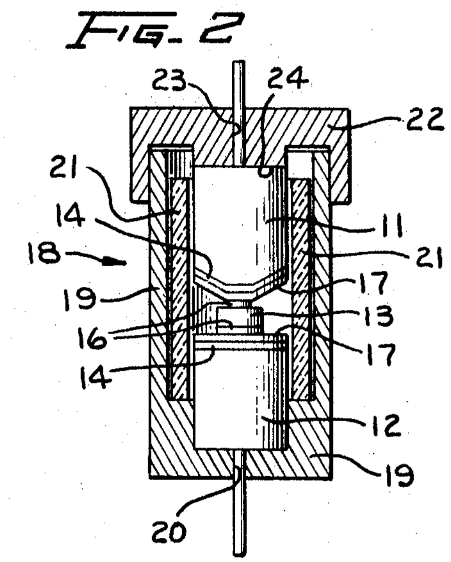
FIG. 2 is a schematic representation of the stud-lead assemblies, the semiconductor wafer and a glass sleeve in an assembly fixture.

As a second step of the method, after the aluminum metal layers 17 have been evaporated onto the nickel coatings 14 of corresponding ones of the stud-lead assemblies 11 and 12, the aluminum layers 17 are brought into physical engagement with corresponding silver contacts 16 on the semiconductor wafer 13, preferably by means of an assembly fixture, designated generally by the numeral 18 in FIG. 2. The assembly fixture 18 is constructed from any suitable material, such as boron nitrite.

With reference to FIG. 2, it may be seen that the stud-lead assembly 12 is positioned in a bottom portion 19 of the assembly fixture 18 in such a manner that a lead portion of the stud-lead assembly 12 extends through an opening 20 in the bottom portion of the fixture. The semiconductor wafer 13 is positioned such that one of the silver contacts 16 thereof rests on the aluminum coating 17 evaporated over the nickel coating 14 of the stud-lead assembly 12.

A glass sleeve 21, which encircles the stud-lead assembly 12, is also positioned in the bottom portion 19 of the assembly fixture 18. The glass utilized in conjunction with the described method may be of a type such as Corning 750A1A glass tubing.

The stud-lead assembly 11 is positioned in the assembly fixture 18 such that the aluminum coating 17 of the stud-lead assembly 11 is in engagement with the upper one of the silver contacts 16 of the semiconductor wafer 13. A top portion or cap member 22 of the assembly fixture 18 is placed over the stud-lead assembly 11 and a portion of the lead thereof extends through an opening 23 in the top portion 22 of the assembly fixture. The top portion 22 of the assembly fixture has a surface 24 thereof which bears against the stud-lead assembly 11, and thereby causes the stud-lead assemblies 11 and 12 to exert an axial compressive force on the semiconductor wafer 13. In such a manner, the aluminum coated surfaces 17 of the respective stud-lead assemblies 11 and 12 are held in firm engagement with respective ones of the silver contacts 16 of the semiconductor wafer 13.

Figure 3:
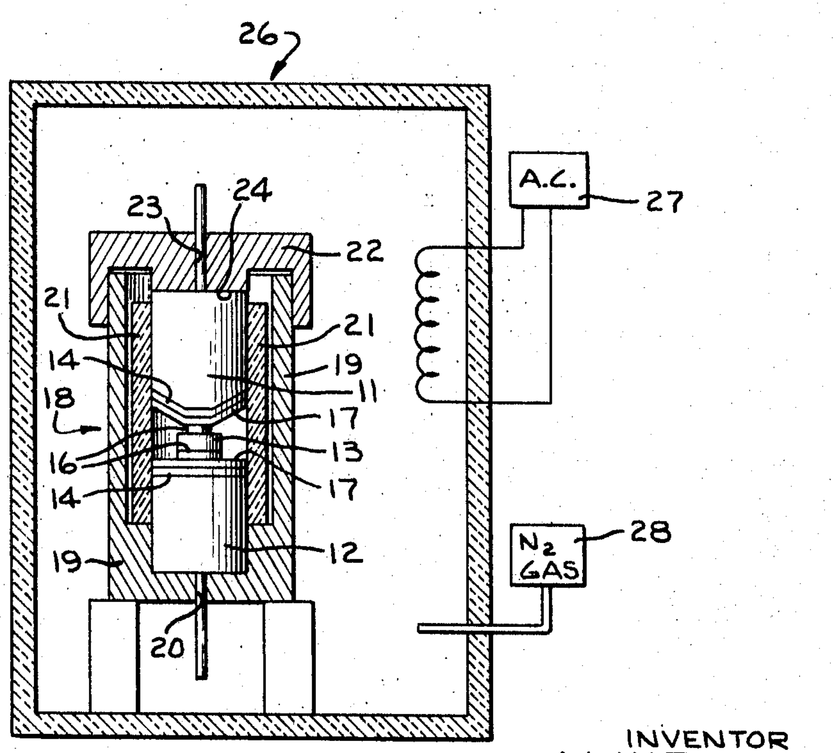
FIG. 3 is a schematic representation of the various portions of the semiconductor device in the assembly fixture during a heating operation.

As a third step in the method of the invention, after the stud-lead assemblies 11 and 12, the semiconductor wafer 13 and the glass sleeve 21 have been positioned in the assembly fixture 18, the assembly fixture is placed in a suitable heating furnace, such as the furnace designated generally by the numeral 26 in FIG. 3, for a heat treating operation. As illustrated in FIG. 3, the furnace 26 has an electrical heating unit 27 and a nitrogen gas supply unit 28 associated therewith. The furnace 26 may also be equipped with other additional units such as apparatus for drawing a vacuum on the furnace (not shown).

In accordance with the teachings of this invention as illustrated in the preferred embodiment thereof, the nickel coated portions 14 of the stud-lead assemblies 11 and 12 are metallurgically bonded to the silver contacts 16 of the semiconductor wafer 13 prior to the encapsulation of at least a portion of the stud-lead assemblies and the semiconductor wafer within the glass sleeve 21. The bonding and encapsulating operation are preferably carried out by introducing nitrogen gas into the furnace 26 from the gas supply unit 28, and simultaneously therewith, heating the furnace to a temperature in the range of 760–775° C. by means of the heating unit 27.

After the furnace 26 has been heated to a predetermined temperature of approximately 660° C., portions of the aluminum coatings 17, on respective ones of the stud-lead assemblies 11 and 12, melt to form a liquid interface between adjacent areas of aluminum 17 and silver 16. Then as the temperature of the furnace 26 is increased beyond the predetermined temperature and approaches a maximum temperature, for example, 760° C., the glass sleeve 21 shrinks about and makes physical gripping contact with the side walls of the stud-lead assemblies 11 and 12. After the furnace has been heated to the maximum temperature, the furnace is cooled slowly, and as it cools the liquid aluminum at the interfaces between the aluminum and silver metallurgically reacts to form an aluminum-silver eutectic alloy therebetween.

After the furnace 26 has cooled to room temperature, the diode semiconductor device is removed from the furnace in completely assembled form. In such form, the diode exhibits metallurgically bonded ohmic contacts which are substantially resistant to shock, vibration and high current pulses. Also, the glass sleeve 21 forms a tight encapsulation medium for at least portions of the two leads of the stud-lead assemblies 11 and 12 and the semiconductor wafer 13.

While the preferred embodiment of the bonding method of this invention has been described in conjunction with the manufacture of encapsulated semiconductor devices, it is obvious to one skilled in the art that this method may be advantageously employed whenever it is desired to provide a reliable electrical, ohmic interconnection by bonding a metal selected from the group consisting of nickel, palladium and platinum, which metal either forms a coating on or at least comprises a portion of one part, to another part having a silver contact surface area thereon, even though such bonding occurs without encapsulation. In such instances, the method of this invention is employed by initially placing a layer of aluminum on at least a selected area of the metal coated part and thereafter bringing the aluminum coated portion of the part into physical engagement with the silver contact area of the other part. The silver and aluminum are then heated, by any suitable means, to a predetermined temperature sufficient to cause at least a portion of the aluminum to melt and form a liquid interface between the aluminum and silver. Thereafter, during cooling of the metals, the liquid aluminum metallurgically reacts with the silver and, when cooled sufficiently, forms an aluminum-silver eutectic alloy which results in a metallurgical bond being formed between the two metals.

There has thus been disclosed herein a preferred method of forming a metallurgically bonded, ohmic connection between a nickel coated surface of one part, such as a stud in a semiconductor diode, and an electrical contact consisting essentially of silver. The bond so formed is substantially resistant to electrical breakdown when stressed by a shock, vibration or high current pulses. Also, the method is simple and reliable in operation and economical to utilize.

While an embodiment of the method of this invention has been disclosed herein, many modifications will be apparent, and it is intended that the invention be interpreted as including all modifications which fall within the true spirit and scope thereof.

What is claimed is:

1. A method of joining and encapsulating the components of a diode wherein the diode components comprise a pair of molybdenum studs with nickel end surfaces and a semiconductor wafer having silver contacts adhered to the opposite faces of the wafer which includes:

applying thin layers of aluminum to the exposed surfaces of nickel;

assembling the components with the aluminum-nickel coated molybdenum studs abutting the silver contacts within a glass sleeve that shrinks and fuses to the molybdenum at a temperature which is greater than a predetermined temperature at which the aluminum and silver melt;

supporting the glass sleeve and one stud with the other components resting thereon and the exposed shanks of the molybdenum studs adjacent the inner wall of the sleeve;

placing a cap member on the other stud to axially compress the components together;

subjecting the glass and the aluminum-silver interface to said predetermined temperature to melt the aluminum and silver at the two interfaces whereupon the cap member urges the components together to displace the molten silver and aluminum over the faces of the nickel and the semiconductor wafer;

then increasing the temperature beyond said predetermined temperature to shrink and fuse the glass sleeve to the exposed shanks of molybdenum studs; and then cooling the assembly of components to form eutectic bonds of aluminum and silver between the semiconductor wafer and the nickel on the molybdenum studs.

2. A method of joining and encapsulating the components of a diode as defined in claim 1 wherein:

the thin layer of aluminum is applied to the exposed surfaces of nickel by an aluminum evaporation process; and wherein the subjecting of the glass and aluminum-silver interfaces to said predetermined temperature and then the increasing of the temperature beyond said predetermined temperature to shrink and fuse the glass sleeve to the studs is carried out at temperatures in the range of 660° C. to 780° C. in a furnace which has an atmosphere therein consisting essentially of an inert gas.

References Cited

UNITED STATES PATENTS

| | | | |
|---|---|---|---|
| 2,497,666 | 2/1950 | Gravley et al. | 117—71 XR |
| 2,682,101 | 6/1954 | Whitfield et al. | 117—71 XR |
| 2,877,396 | 3/1959 | Armstrong et al. | 29—589 XR |
| 2,937,324 | 5/1960 | Kroko | 29—589 |
| 3,180,022 | 4/1965 | Briggs et al. | 29—502 XR |
| 3,225,273 | 12/1965 | Bakker et al. | 29—589 XR |
| 3,228,104 | 1/1966 | Emeis | 29—589 |
| 3,279,038 | 10/1966 | Coper | 29—588 XR |

JOHN F. CAMPBELL, *Primary Examiner.*

R. B. LAZARUS, *Assistant Examiner.*

U.S. Cl. X.R.

29—472.3, 472.9, 473.5, 504, 589